(12) United States Patent
Xi et al.

(10) Patent No.: US 8,482,967 B2
(45) Date of Patent: Jul. 9, 2013

(54) MAGNETIC MEMORY ELEMENT WITH MULTI-DOMAIN STORAGE LAYER

(75) Inventors: Haiwen Xi, San Jose, CA (US); Yuankai Zheng, Fremont, CA (US); Xiaobin Wang, Chanhassen, MN (US); Dimitar V. Dimitrov, Edina, MN (US); Pat J. Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 169 days.

(21) Appl. No.: 12/938,424

(22) Filed: Nov. 3, 2010

(65) Prior Publication Data

US 2012/0106239 A1 May 3, 2012

(51) Int. Cl.
*G11C 11/00* (2006.01)
*G11C 11/14* (2006.01)
*G11C 11/15* (2006.01)

(52) U.S. Cl.
USPC ............................ 365/158; 365/171; 365/173

(58) Field of Classification Search
USPC ......................................... 365/158, 171, 173
See application file for complete search history.

(56) References Cited

U.S. PATENT DOCUMENTS

| | | | |
|---|---|---|---|
| 5,461,526 A | 10/1995 | Hamakawa et al. | |
| 5,841,692 A | 11/1998 | Gallagher et al. | |
| 6,166,948 A | 12/2000 | Parkin et al. | |
| 6,781,874 B2 | 8/2004 | Hidaka | |
| 6,888,742 B1 | 5/2005 | Nguyen et al. | |
| 7,180,113 B2 | 2/2007 | Braun | |
| 7,411,817 B2 | 8/2008 | Nozieres et al. | |
| 7,697,313 B2 * | 4/2010 | Klostermann | 365/158 |
| 7,751,223 B2 * | 7/2010 | Kim et al. | 365/158 |
| 7,859,881 B2 * | 12/2010 | Iwata et al. | 365/158 |
| 7,860,351 B2 * | 12/2010 | Yagami | 365/158 |
| 7,924,593 B2 * | 4/2011 | Lee et al. | 365/158 |
| 8,023,315 B2 * | 9/2011 | Fukami | 365/158 |
| 8,098,514 B2 * | 1/2012 | Nagase et al. | 365/158 |
| 8,120,950 B2 * | 2/2012 | Fukami et al. | 365/158 |
| 8,149,615 B2 * | 4/2012 | Fukami et al. | 365/158 |
| 8,159,865 B2 * | 4/2012 | Ohmori | 365/158 |
| 2005/0104146 A1 | 5/2005 | Nickel et al. | |
| 2008/0019040 A1 | 1/2008 | Zhu et al. | |
| 2010/0034008 A1 | 2/2010 | Wang et al. | |

OTHER PUBLICATIONS

M. T. Johnson, P. J. H. Bloemen, F. J. A. Den Broeder and J. J. De Vries, "Magnetic anisotropy in metallic multilayers," Rep. Prog. Phys., 1996, pp. 1409-1458, vol. 59, IOP Publishing Ltd., UK.

L. Zhang, J. Bain, J. Zhu, L. Abelmann and T. Onoue, "Heat-assisted magnetic probe recording on a granular CoNi/Pt multilayered film," Journal of Physics D: Applied Physics, 2006, pp. 2485-2487, vol. 39, IOP Publishing Ltd., UK.

* cited by examiner

*Primary Examiner* — Trong Phan
(74) *Attorney, Agent, or Firm* — Hall Estill Attorneys at Law

(57) ABSTRACT

An apparatus and method for enhancing data writing and retention to a magnetic memory element, such as in a non-volatile data storage array. In accordance with various embodiments, a programmable memory element has a reference layer and a storage layer. The reference layer is provided with a fixed magnetic orientation. The storage layer is programmed to have a first region with a magnetic orientation antiparallel to said fixed magnetic orientation, and a second region with a magnetic orientation parallel to said fixed magnetic orientation. A thermal assist layer may be incorporated into the memory element to enhance localized heating of the storage layer to aid in the transition of the first region from parallel to antiparallel magnetic orientation during a write operation.

20 Claims, 5 Drawing Sheets

MAGNETIC MEMORY ELEMENT WITH MULTI-DOMAIN STORAGE LAYER

SUMMARY

Various embodiments of the present invention are generally directed to an apparatus and method for enhancing data writing and retention to a magnetic memory element, such as in a non-volatile data storage array.

In accordance with various embodiments, a programmable memory element has a reference layer and a storage layer. The reference layer is provided with a fixed magnetic orientation. The storage layer is programmed to have a first region with a magnetic orientation antiparallel to said fixed magnetic orientation, and a second region with a magnetic orientation parallel to said fixed magnetic orientation. In some embodiments, a thermal assist layer may be incorporated into the memory element to enhance localized heating of the storage layer to aid in the transition of the first region from parallel to antiparallel magnetic orientation during a write operation.

These and various other features and advantages which characterize the various embodiments of the present invention can be understood in view of the following detailed discussion and the accompanying drawings.

DETAILED DESCRIPTION

The present disclosure is generally directed to improvements in the manner in which data are written to and retained by a magnetic memory cell. Some types of storage devices utilize a solid-state data storage array of memory cells, with each cell being individually programmable to a selected programmed state. The cells may be volatile or non-volatile, and can take a write-once or write-many configuration.

Of particular interest are magnetic memory data storage cells that utilize magnetic tunneling to establish a selected programmed state, such as in the case of spin-torque transfer random access memory (STRAM) cells. A magnetic memory cell can include an antiferromagnetic reference layer with a selected magnetic orientation, and a free layer with a selectively programmable magnetic orientation. The relative orientation of the free layer with respect to the reference layer determines an overall electrical resistance of the cell.

Generally, a parallel orientation will provide a first electrical resistance through the cell, and an anti-parallel orientation will provide a second electrical resistance through the cell. The programmed state of a given cell can be determined by sensing a voltage drop across the cell responsive to the application of a low magnitude read current.

While operable, a limitation associated with many types of magnetic memory elements relate to the write effort required to establish different programmed states. Significant amounts of write current and/or write current pulse duration may be required to transition the cell to a selected state, particularly when the cell is switched to the antiparallel orientation.

Accordingly, various embodiments of the present invention are generally directed to an apparatus and method for enhancing the ability to write data to and retain the written data in a magnetic memory data storage cell. As explained below, a free layer is sized relative to a reference layer within a magnetic memory element so that the free layer has multiple magnetic domains in at least one programmed state. In some embodiments, a thermal assist layer is incorporated into the cell structure to assist in the writing process. The cell structure is particularly suitable for use as a write-once memory as an alternative to fuse-based random access memories (ROMs). The cell structure can also be configured as a write-many memory as an alternative to flash and electrically erasable and programmable read only memories (EEPROMs).

Figure 1:
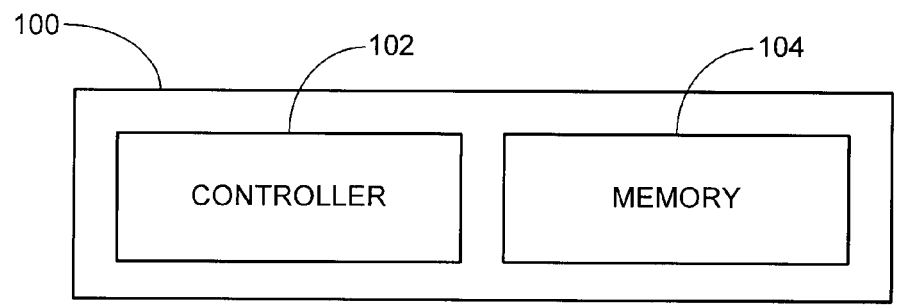
FIG. 1 provides a functional block representation of a data storage device.

FIG. 1 provides a simplified block representation of a data storage device 100 to illustrate an exemplary environment in which various embodiments of the present invention can be advantageously practiced. The device 100 includes a top level controller 102 and a memory module 104. The controller 102 may be programmable or hardware based and provides top level control of I/O operations with a host device (not shown). The controller 102 may be a separate component or may be incorporated directly into the memory module 104.

Figure 2:
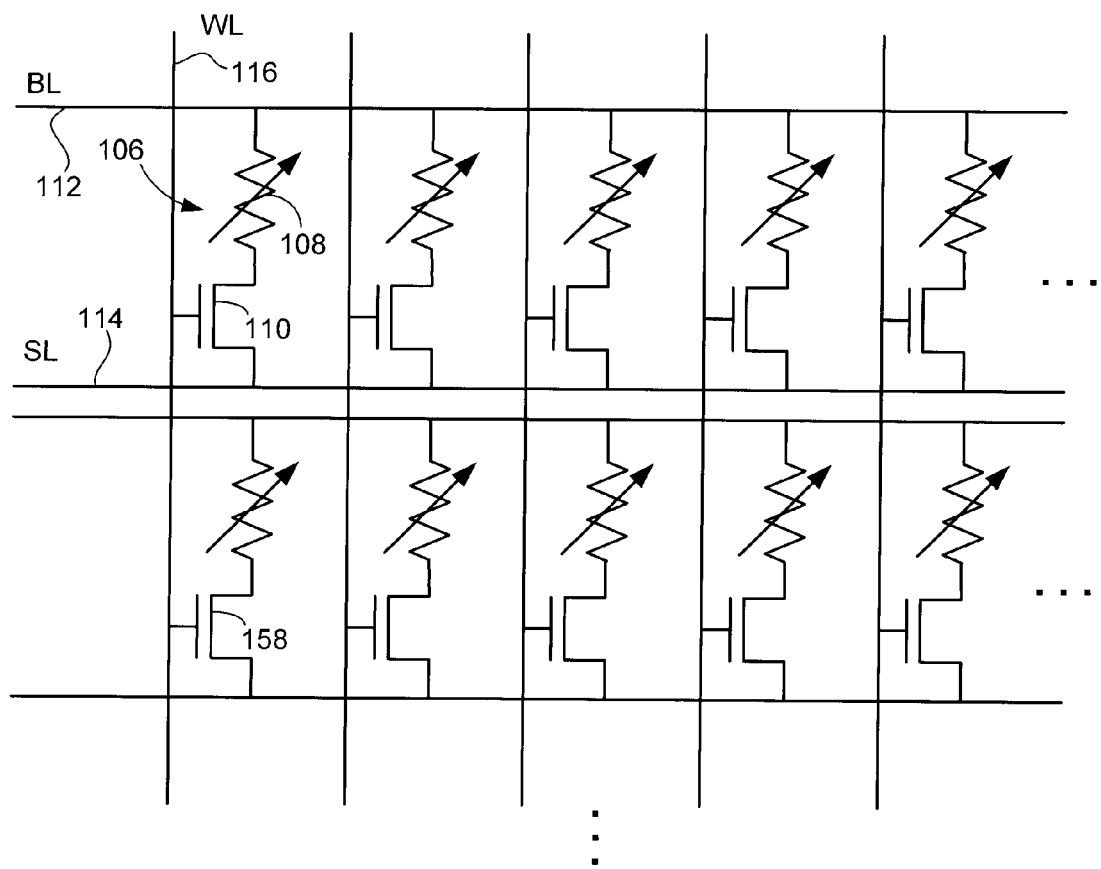
FIG. 2 depicts a portion of a memory module of FIG. 1.

The memory module 104 includes an array of non-volatile memory cells 106 as set forth in FIG. 2. Each memory cell 106 includes a magnetic memory data storage element 108 and a switching device 110. While not limiting, it is contemplated that the memory cells 106 are spin-torque transfer random access memory (STRAM) cells. The memory elements 108 incorporate magnetic tunneling junctions (MTJs) and the switching devices 110 are n-channel metal oxide semiconductor field effect transistors (nMOSFETs). Other configurations can be used.

The memory elements 108 are depicted as variable resistors selectively programmable to different resistive states. In some embodiments, single level cells (SLCs) are used with a low resistance $R_L$ corresponding to a first stored data state of logical 0, and a high resistance $R_H$ corresponding to a second stored data state of logical 1. The cells may alternatively be configured as multiple level cells (MLCs) to store multiple bits per cell, such as the use of four different programmed resistances to store two bits per cell.

Data access operations are carried out via bit lines (BL) 112, source lines (SL) 114 and word lines (WL) 116. The source lines 114 may be connected to a common source plane. The memory module 104 may be arranged into addressable blocks of fixed-size storage, with each block being separately allocated as needed. The blocks may further be arranged as a plurality of pages which are concurrently written or read during data access operations, with each page constituting all of the cells 106 coupled to a common word line 116. In this way, the module 104 can be configured and operated in a manner similar to a flash array. It will be appreciated that other configurations can be used, such as cross-point arrays with diodes or other suitable mechanisms to direct access currents through the cells.

Figure 3:
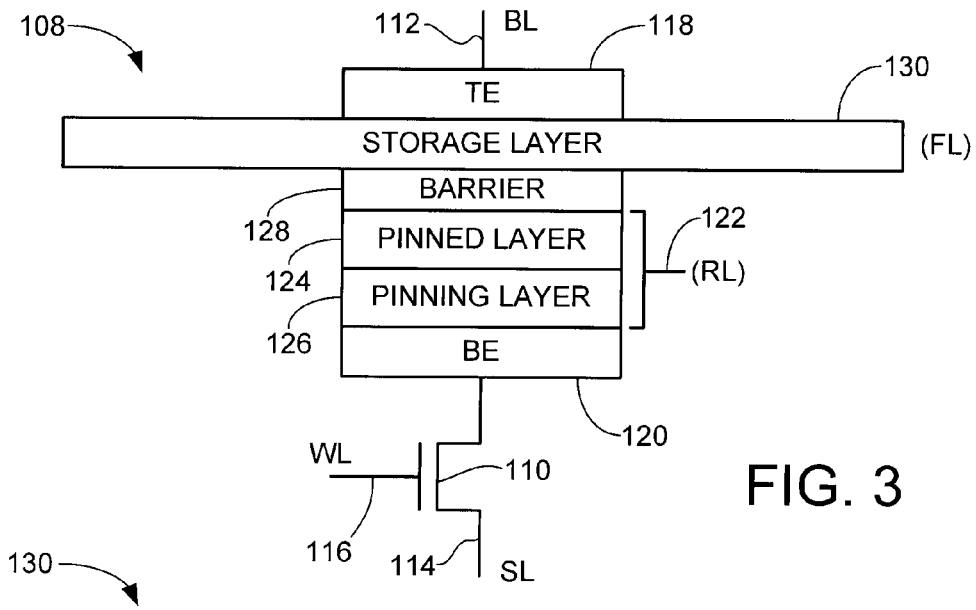
FIG. 3 shows an exemplary construction for a magnetic memory element of FIG. 2.

FIG. 3 provides a schematic representation of an exemplary configuration for the memory elements 108 of FIG. 2. Each memory element 108 includes top and bottom electrodes 118, 120 (TE and BE, respectively). A reference layer (RL) 122 is provided with a fixed magnetic orientation in a selected direction. The reference layer 122 can take a number of forms, such as an antiferromagnetic pinned layer 124 with the fixed magnetic orientation established by an adjacent pinning layer 126. A barrier layer 128 separates the reference layer 122 from a soft ferromagnetic free layer 130, also referred to herein as a storage layer.

The storage layer 130 has a selectively programmable magnetic orientation that is established responsive to the application of write current to the element 108. The orientation of the storage layer 130 may be in the same direction as the orientation of the reference layer 122 (parallel), or may be in the opposing direction as the orientation of the reference layer 122 (antiparallel). Parallel orientation provides a lower resistance $R_L$ through the memory cell, and antiparallel orientation provides a higher resistance $R_H$ through the cell. It is contemplated that the magnetization direction will be perpendicular (i.e., in the vertical direction with respect to the drawing) but this is not necessarily required.

The storage layer 130 is shown to have a greater areal extent than the areal extent of the reference layer 122. This allows the storage layer to establish and maintain multiple opposing magnetic domains during programming. The respective reference and storage layers 122, 130 may be circular (disc shaped), with the storage layers having a larger diameter than the reference layers. Other shapes for the reference and/or storage layers may be used, however, such as rectilinear. The storage layers may be discrete layers within each memory cell, or may be formed from a single layer that continuously extends across the array.

Figure 4:
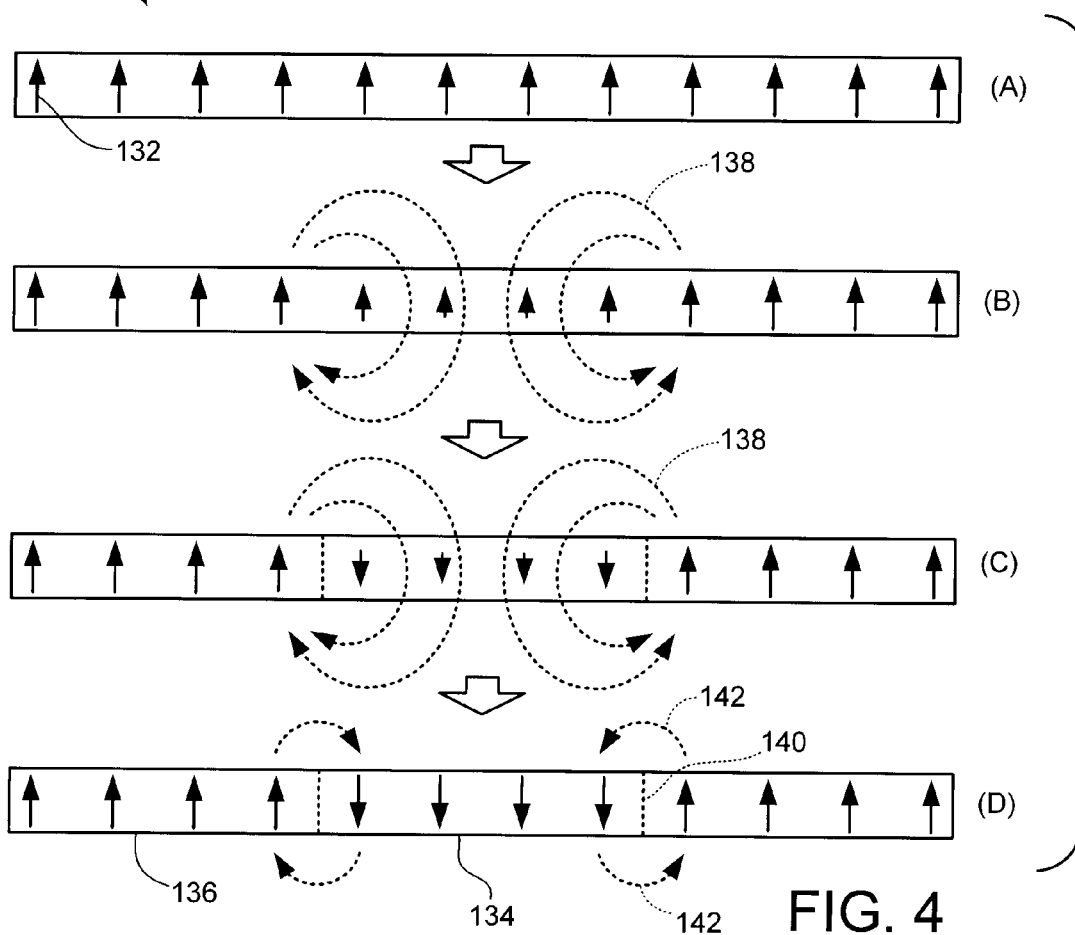
FIG. 4 illustrates a write sequence used to transition the memory element of FIG. 3 from a first resistive state to a second resistive state.

FIG. 4 shows an exemplary write sequence for the storage layer 130 of FIG. 3. Four successive steps are identified as (A) through (D). At step (A), the storage layer 130 is shown to have an initial magnetic orientation, as represented by upwardly extending arrows 132. This initial magnetic orientation is parallel to the magnetic orientation of the reference layer 122, and places the element 108 in the low resistive state $R_L$ (e.g., logical 0).

It will be noted that the magnetic orientation of the storage layer 130 in step (A) is arranged as a single magnetic domain, in that the entire storage layer 130 is uniformly magnetized so as to be parallel with the magnetization of the reference layer. To establish the initial state of step (A), the magnetic stack can be saturated in a strong magnetic perpendicular field so the magnetizations of the pinned layer and the data storage layer are pointing in the same direction.

To write the element 108 to the high resistive state $R_H$ (e.g. logical 1), a suitable write current is applied through the element, as shown beginning at step (B). This write current does not pass through all of the storage layer 130, but rather passes substantially through that portion of the storage layer 130 that is aligned with the reference layer 122. This middle region of the storage layer is denoted as 134, and undergoes a localized change in magnetization responsive to the current and the associated heating provided by $I^2R$ heat dissipation through the storage layer. As the write current passes through the middle of the storage layer 130, an outer annular region 136 of the storage layer retains its initial magnetic orientation 132.

During initial application of the write current, the magnetization of region 134 remains parallel to the magnetization of the reference layer 122 (FIG. 3), but is reduced in magnitude as shown at step (B). Due to the non-uniform magnetization of the middle region 134, a demagnetizing field 138 will be generated. As the write current continues to be applied, the demagnetizing field acts to reverse the magnetization of the middle region, as indicated at step (C).

Once the write current has been removed and the data storage layer 130 returns to ambient temperature, the magnetization of the middle region 134 will have been reversed, as shown at step (D). A circumferentially extending domain wall 140 will be established between the antiparallel middle region 134 and the surrounding, parallel outer region 136. Magnetic coupling across the domain wall 140 is represented by dashed arrows 142, and this magnetic coupling helps to retain the antiparallel magnetization of the middle region 134.

The magnetic dipole coupling between the respective magnetic domains of regions 134, 136 will compete with the domain wall 140 for a short time until a steady-state condition is reached. Once the cell is stabilized, the central domain size (diameter of the domain wall 140) will be determined by a number of properties associated with the data storage layer. These properties may include intrinsic characteristics such as saturation magnetization, exchange coupling, and magnetic anisotropy, as well as extrinsic characteristics such as the thickness and surface roughness of the data storage layer.

Figure 5:
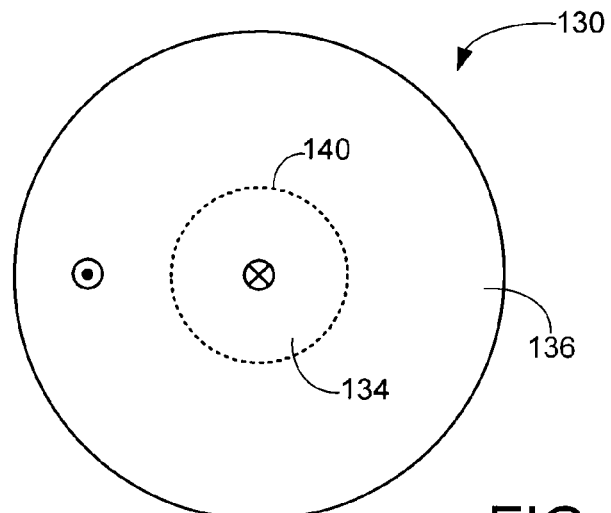
FIG. 5 shows a top plan view representation of the storage layer of FIG. 4 in the second resistive state.

The size of the central domain may further be established in relation to the amount of heating experienced by the storage layer, and other current induced effects such as the magnitude, direction, duration and current pulse shape. Any number of suitable ferromagnetic films can be used for the storage layer 130, such as Cobalt-Nickel (CoNi) and Platinum (Pt) based films. Different films may provide different domain sizes responsive to a given write current. FIG. 5 shows exemplary sizes of the respective regions 134, 136 at the conclusion of the write sequence of FIG. 4.

Figure 6:
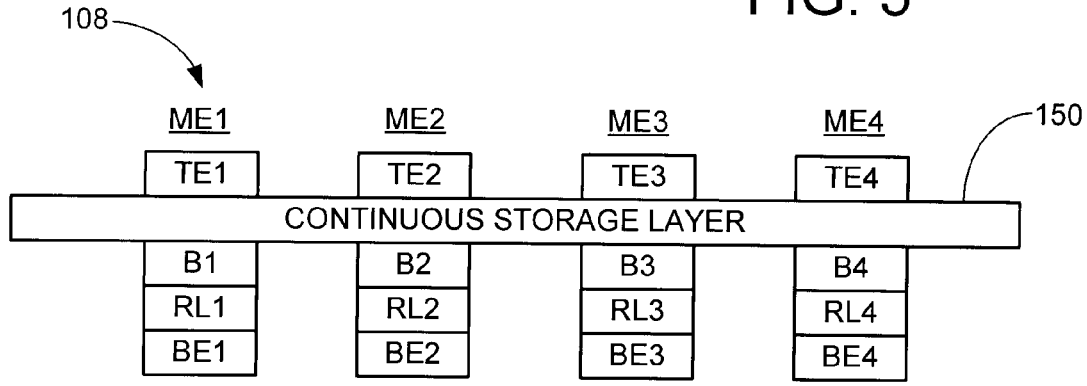
FIG. 6 depicts a plurality of adjacent memory elements that share a continuous storage layer.

FIG. 6 is an elevational representation of a number of the memory elements 108 (denoted ME1-ME4) that share a continuous data storage layer 150. Empirical analysis has indicated that localized magnetization reversal of some types of magnetic films as set forth by FIG. 6 can be carried out by the application of write current pulses on the order of about +5 volts, V in amplitude and about 500 nanoseconds, ns in duration. The magnitude of write current can be on the order of about 100 microamps, μA. Other suitable values can be used.

Figure 7:
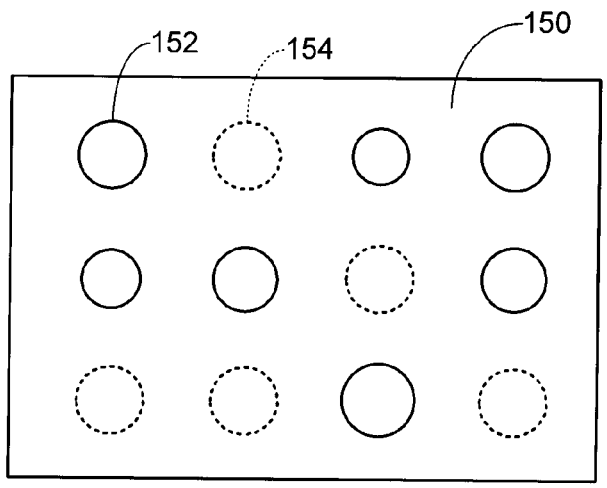
FIG. 7 represents different regions of the continuous storage layer of FIG. 6 with transitioned magnetic domains in accordance with FIGS. 4-5.

FIG. 7 is a top plan representation of the continuous storage layer 150 of FIG. 6 to which write pulses have been applied to provide localized circular regions 152 of antiparallel magnetization. For reference, regions 154 represent middle portions of memory cells which retain the initial parallel magnetization. The average size of the programmed regions may be on the order of about 100 nanometers, nm, although programmed regions as small as about 70 nm were also observed. The coercivity of the magnetic films can be as high as 5,000 Oe. Magnetization reversal by heating may be easier to achieve in lower coercivity films, and the domains may be larger on magnetic films with lower coercivity. In addition, the diameter of the domains may be dependent on the pulse amplitude and duration.

The memory array can be used as a write-once read-many magnetic memory array will all of the cells 108 initially programmed to the low resistance (logical 0) state. To write data, logical 1s can be written in the appropriate locations as set forth by FIG. 4.

To subsequently read back the stored data, the word lines 116 can be activated to place the switching device 110 of each selected cell in turn into a source-drain conductive state, a low magnitude read current can be passed from the associated bit line 112 to the associated source line 114, and the magnitude of the voltage drop across the cell can be sensed using a sense amplifier or other suitable detection mechanism. Since the read current will tend to select the shortest path through the cell, it is contemplated that a majority of the read current will pass through the middle region 134 (FIG. 4) of the data storage layer. The resistance of the magnetic stack will thus vary in relation to the magnetization orientation of the middle region with respect to the magnetization of the pinned layer.

Figure 8:
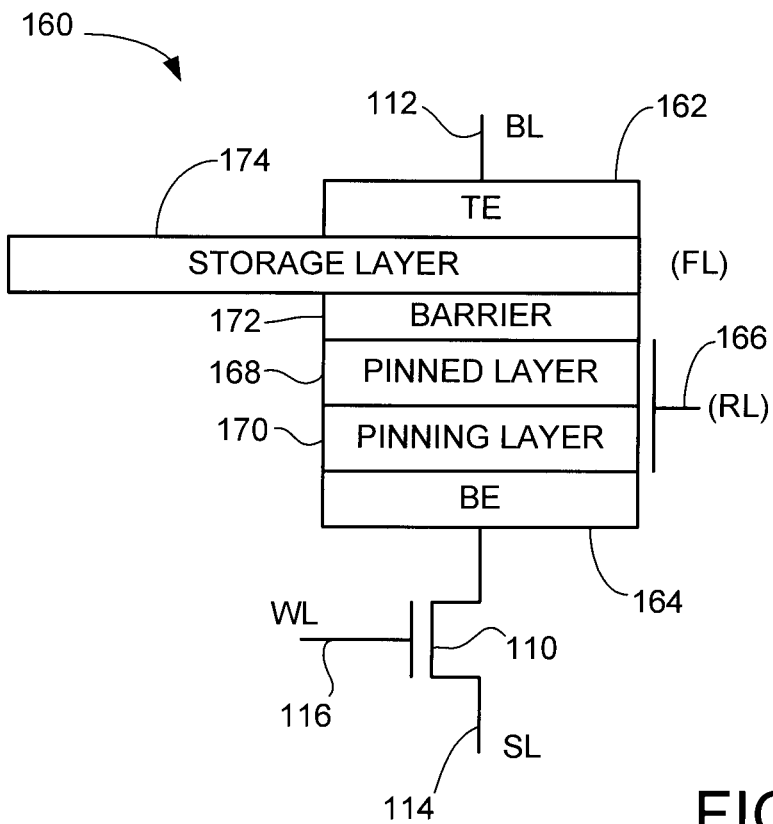
FIG. 8 shows an alternative configuration for a memory element in accordance with various embodiments.
Figure 9:
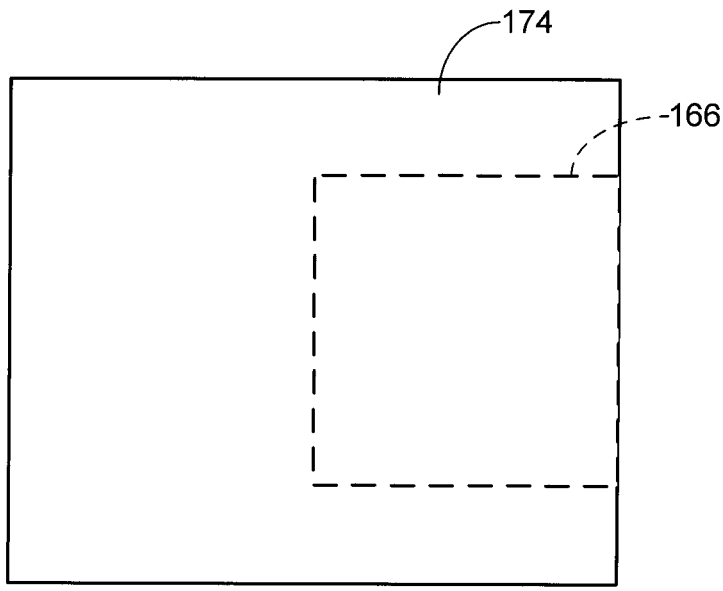
FIG. 9 is a top plan view of the storage layer and reference layer of FIG. 8.

An alternative construction for a memory element in accordance with various embodiments is shown at 160 in FIG. 8. The memory element 160 includes top and bottom electrodes 162, 164, a reference layer (RL) 166 with pinned and pinning layers 168, 170, a barrier layer 172, and free layer (FL) 174. The free layer (storage layer) 174 is offset in relation to the reference layer 166, such as shown by FIG. 9 which provides exemplary rectilinear areal shapes of these respective layers. Other configurations are contemplated, such as a strip of storage layer material that is offset to span multiple adjacent cells along a selected row or column in an array.

Figure 10:
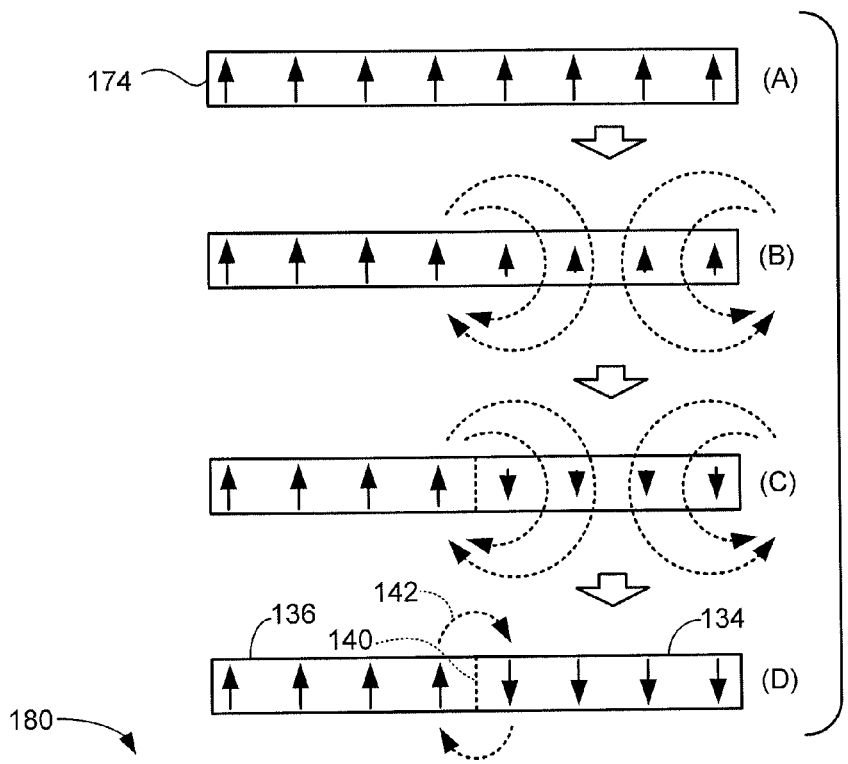
FIG. 10 illustrates a write sequence used to transition the memory element of FIG. 8 from a first resistive state to a second resistive state.

A write sequence for the storage layer 174 is depicted by FIG. 10. The write sequence is generally similar to that previously discussed in FIG. 4 except that the domain wall 140 extends across the storage layer 174 so that the parallel region 136 extends adjacent to, but does not fully encircle, the antiparallel region 134.

Figure 11A:
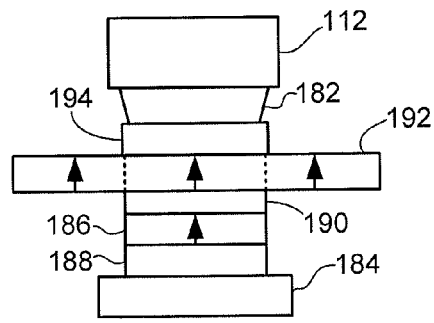
FIGS. 11A-11D show further alternative configurations for a memory element in accordance with various embodiments.

FIGS. 11A-11D show further alternative memory element configurations. FIG. 11A illustrates a memory element 180 with top and bottom electrodes 182, 184, pinned layer 186, pinning layer 188, barrier layer 190 and storage layer 192. These layers are generally similar to the layers set forth in FIG. 3. A thermal assist layer 194 is additionally incorporated into the element 180. The thermal assist layer 194 is in contacting engagement with the storage layer 192 opposite the tunnel barrier 190.

The thermal assist layer 194 is formed of a thermally resistive material which operates to enhance the heating effect during writing. This generally allows higher localized temperatures to be established in the middle region 134 with a lower current pulse and/or duration. The thermal assist layer 194 can take a variety of forms, such as a relatively thin dielectric layer (e.g., MgO) or electrically conductive materials such as Tantalum (Ta), Bismuth-Tellurium (BiTe) or Chromium-Platinum-Manganese-Boron (CrPtMnB) alloys. As before, the storage layer 192 can be a continuous layer or a discrete region within each memory element.

Figure 11B:
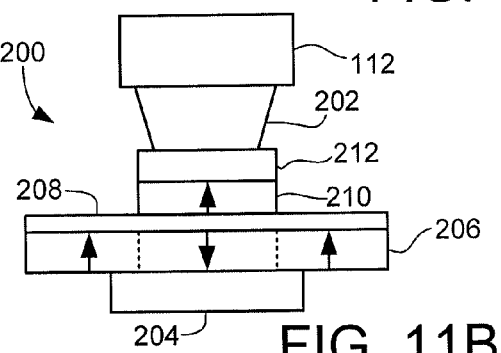
Figure 11C:
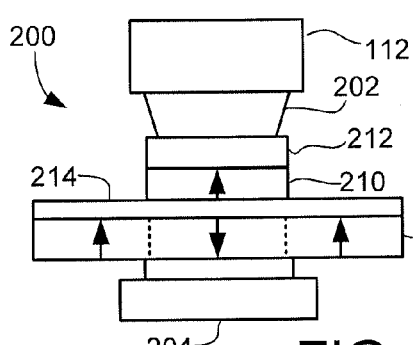

FIG. 11B shows a memory element 200 with a reversed stack orientation that may provide certain manufacturing efficiencies. Top and bottom electrodes are shown at 202, 204. A storage layer 206 is formed on the bottom electrode 204, followed by a tunnel barrier 208 and pinned/pinning layers 210, 212. A layer of thermal assist material 214 can be incorporated into the memory element 200 as depicted in FIG. 11C.

Figure 11D:
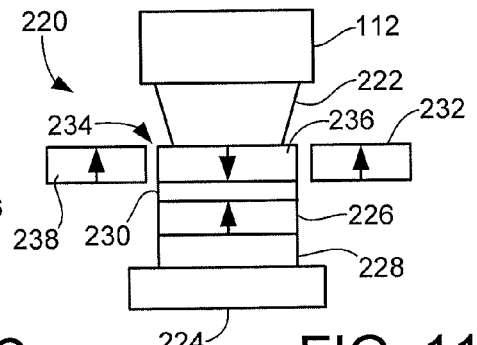

FIG. 11D shows another memory element 220 with top and bottom electrodes 222, 224, pinned/pinning layers 226, 228, tunnel barrier 230 and a segmented storage layer 232. During manufacturing the storage layer 232 can be etched to provide an annular groove 234 that extends fully or partially through the thickness of the storage layer 232, thereby physically separating a middle antiparallel region 236 and a surrounding parallel region 238. The groove 234 can be filled with a suitable oxide or other material to enhance domain wall location and stability. As before, thermal assist material can be incorporated into the stack to enhance writing efficiency.

Other configurations will readily occur to the skilled artisan in view of the present disclosure, such as cell stack structures with multiple free layers including multiple continuous storage layers that span the memory cells in an array, or structures that have one continuous storage layer that spans the memory cells in an array and at least one additional localized free layer in each cell. Multiple reference layers may also be provided in each cell, including reference layers that span multiple memory cells in an array.

It will now be appreciated that the various embodiments disclosed herein can provide a number of benefits. Establishing multiple magnetic domains within a continuously extending storage layer can enhance the ability to write and retain data within the memory cell. The non-transitioned portion(s) of the storage layer can assist in the magnetic switching of the transitioned portion(s) of the layer during the writing operation, and the non-transitioned portion(s) can further help to maintain the transitioned portion(s) in the desired orientation after the writing operation has completed. The use of thermal assist material can enhance the localized writing of the transitioned domains, allowing the use of reduced write current magnitudes and/or durations.

The various embodiments disclosed herein are suitable for use in a write-once memory. The initial orientations of the reference and free (storage) layers can be induced during manufacturing from an external magnetic source, and then the local areas of reversed magnetization within the storage layer can be generated as desired to write data to the memory. However, it is contemplated that the various memory elements disclosed herein can be readily rewritten to the initial state by the application of appropriate write current and duration to reverse the process and provide the storage layer with a single domain.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a programmable memory element with a reference layer and a storage layer, the reference layer having a fixed magnetic orientation, the storage layer having a first region with a magnetic orientation antiparallel to said fixed magnetic orientation and a continuous second region which fully surrounds the first region and has a magnetic orientation parallel to said fixed magnetic orientation, wherein programming current passes through the reference layer and the first region of the storage layer in an axial direction through the memory element, and the first and second regions of the storage layer extend along a plane perpendicular to said axial direction.

2. The apparatus of claim 1, in which the first region is disk-shaped and the second region is an annular ring surrounding the disk-shaped first region.

3. The apparatus of claim 1, in which a tunneling barrier is contactingly disposed between the reference layer and the first region of the storage layer to form a magnetic tunneling junction adapted to program the magnetic orientation of the first region.

4. The apparatus of claim 1, in which the storage layer further comprises at least one magnetic domain wall that extends through a thickness of the storage layer to separate the first region from the second region, said at least one magnetic domain wall fully surrounding the first region.

5. The apparatus of claim 1, further comprising a continuous, intervening oxide layer disposed between the first and second regions.

6. The apparatus of claim 1, in which the reference layer has a first areal extent perpendicular to said axial direction, the storage layer has a second, greater areal extent lying along the plane perpendicular to said axial direction, and the second region is disposed beyond said first areal extent of the reference layer.

7. The apparatus of claim 1, further comprising a switching device serially connected to the magnetic memory element to form a non-volatile memory cell.

8. The apparatus of claim 1, in which the memory element is a selected memory element in an array of nominally identical memory elements that form a data storage array, each of the memory elements in the array having a separate reference layer, the storage layer of the selected memory element fanning a portion of a continuous layer that extends adjacent each of the reference layers of the nominally identical memory elements in said array.

9. The apparatus of claim 1, in which the memory element further comprises a thermal assist layer contactingly engaging the first region of the storage layer opposite the reference layer to facilitate localized heating of the storage layer to transition the magnetic orientation of the first region from said parallel orientation to said antiparallel orientation responsive to application of a write current through said memory element, said write current not altering the parallel orientation of the second region.

10. The apparatus of claim 1, in which the memory element is programmed by steps comprising:
providing the storage layer with a common parallel magnetic orientation in both the first and second regions thereof; and
passing a write current through the storage layer and the reference layer to transition the magnetic orientation of the first region to said antiparallel orientation while retaining the magnetic orientation of the second region in said parallel orientation.

11. An apparatus comprising a data storage memory having an array of non-volatile memory cells, each memory cell comprising a memory element coupled to a switching device, each memory element comprising a reference layer and a storage layer, the reference layer having a fixed magnetic orientation and a first overall areal extent in a direction perpendicular to a direction of current flow through the memory element, the storage layer having a first region axially aligned with the reference layer and having said first overall areal extent with a magnetic orientation antiparallel to said fixed magnetic orientation and a continuous second region with a magnetic orientation parallel to said fixed magnetic orientation, the second region separated from the first region by a circumferentially extending magnetic domain wall that fully surrounds the first region.

12. The apparatus of claim 11, in which each memory cell further comprises a tunneling barrier contactingly disposed between the reference layer and the first region of the storage layer to form a magnetic tunneling junction, and a thermal assist layer contactingly engaging the storage layer opposite the tunneling barrier.

13. The apparatus of claim 11, in which the memory element is adapted to receive a flow of write current along a selected axial direction through the cell to selectively program said storage layer, the reference layer has a first areal extent lying along a plane perpendicular to said axial direction, and the storage layer has a second, greater areal extent lying along a plane perpendicular to said axial direction.

14. The apparatus of claim 11, in which each said memory element is adapted to be programmed by steps comprising:
providing the associated storage layer with a common parallel magnetic orientation in both the first and second regions thereof; and
passing a write current through the associated storage layer and the associated reference layer to transition the magnetic orientation of the first region to said antiparallel orientation while retaining the magnetic orientation of the second region in said parallel orientation.

15. The apparatus of claim 11, in which said array of non-volatile memory cells is characterized as an array of spin-torque transfer random access memory (STRAM) cells.

16. A method comprising:
providing a programmable memory element with a reference layer and a storage layer aligned with the reference layer with respect to an axial direction of current flow through the memory element, the reference layer having a fixed magnetic orientation and the storage layer having a common magnetic orientation parallel to said fixed magnetic orientation; and
applying a write current through the storage layer and the reference layer to transition a first region of the storage layer to a magnetic orientation that is antiparallel to said fixed magnetic orientation, wherein at a conclusion of said application of write current a contiguous second region of the storage layer surrounding the first region retains said parallel orientation, the contiguous second region and the first region aligned in a plane perpendicular to said axial direction of current flow.

17. The method of claim 16, in which the providing step further comprises providing the memory element with a tunneling barrier contactingly disposed between the reference layer and the first region of the storage layer to form a magnetic tunneling junction, and a thermal assist layer contactingly engaging the storage layer opposite the tunneling barrier to thermally assist the transition of the first region from parallel to antiparallel during the applying step.

18. The method of claim 16, in which the applying step comprises applying the write current along a selected axial direction through the memory element, and the providing step comprises providing the reference layer with a first areal extent lying along a plane perpendicular to said axial direction and the storage layer with a second areal extent lying along a plane perpendicular to said axial direction that is greater than the first areal extent.

19. The method of claim 16, in which the applying step forms the first region as a disk-shaped region and the second region as a closed annular ring fully surrounding the disk-shaped first region.

20. The method of claim 16, in which the providing step comprises providing the memory element as a selected memory element in an array of nominally identical memory elements that form a data storage array, each of the memory elements having an associated reference layer, and the storage layer of the selected memory element forms a portion of a continuous layer that extends through each of said nominally identical memory elements in said array adjacent the associated reference layers so that programming currents applied to each of the memory elements passes through the associated reference layer and through the continuous storage layer.

* * * * *

UNITED STATES PATENT AND TRADEMARK OFFICE
CERTIFICATE OF CORRECTION

PATENT NO. : 8,482,967 B2  
APPLICATION NO. : 12/938424  
DATED : July 9, 2013  
INVENTOR(S) : Haiwen Xi et al.

Page 1 of 1

It is certified that error appears in the above-identified patent and that said Letters Patent is hereby corrected as shown below:

In the Claims

In Col. 7, line 19  
replace "fanning"  
with "forming"

Signed and Sealed this  
Twelfth Day of November, 2013

Teresa Stanek Rea  
*Deputy Director of the United States Patent and Trademark Office*